United States Patent [19]

Goodrich, Jr. et al.

[11] Patent Number: 4,538,270
[45] Date of Patent: Aug. 27, 1985

[54] METHOD AND APPARATUS FOR TRANSLATING A PREDETERMINED HAMMING CODE TO AN EXPANDED CLASS OF HAMMING CODES

[75] Inventors: Edgar R. Goodrich, Jr., Lubbock; Philip Navratil, Austin, both of Tex.

[73] Assignee: Motorola, Inc., Schaumburg, Ill.

[21] Appl. No.: 481,606

[22] Filed: Apr. 4, 1983

[51] Int. Cl.³ .............................................. G06F 11/12
[52] U.S. Cl. ..................................................... 371/37
[58] Field of Search ...................... 371/37, 38, 49, 39, 371/40, 50

[56] References Cited

U.S. PATENT DOCUMENTS 3,949,208  4/1976  Carter ................................... 371/38
4,030,067  6/1977  Howell et al. ........................ 371/37
4,201,337  5/1980  Lewis et al. ......................... 371/37

Primary Examiner—Michael R. Fleming
Attorney, Agent, or Firm—Anthony J. Sarli, Jr.; Jeffrey Van Myers; Robert L. King

[57] ABSTRACT

An error checking and correcting (ECC) system implemented in large scale integration (LSI) form having a predetermined Hamming code checks the accuracy of data and corrects the data via check bits. A method and apparatus for translating the predetermined Hamming code to an expanded class of Hamming codes is disclosed.

5 Claims, 6 Drawing Figures

*— PRIOR ART —*

METHOD AND APPARATUS FOR TRANSLATING A PREDETERMINED HAMMING CODE TO AN EXPANDED CLASS OF HAMMING CODES

TECHNICAL FIELD

This invention relates generally to an error checking and correcting (ECC) system and, more particularly, to translating a predetermined Hamming code in an ECC system to an expanded class of Hamming codes.

BACKGROUND ART

In an error checking and correcting (ECC) system, binary bit errors are detected and corrected by encoding data with check bits in accordance with a specified Hamming code. The check bits are stored in a memory and later recalled when the accuracy of the data is desired to be checked. At that time, the data is decoded and new check bits are compared with the check bits from memory in order to generate a syndrome code. From the syndrome code, the ECC system can determine if an error exists in the input data bits. ECC systems with bit slice subsystems have been implemented in LSI form with Hamming codes which allow cascading of multi-byte words. Such a subsystem has been implemented by Fujitsu Limited using an LSI ECC chip labeled MB1412A.

A problem typically results when a user of an LSI ECC system provided by a manufacturer decides to use the manufacturer's system. In such an application, the user must design his ECC system with the manufacturer's fixed Hamming code. In most cases, this puts retraints on the form which the Hamming code must take. If the user's system does not conform to the manufacturer's Hamming code, the user is forced to design his own Hamming code with SSI circuits such as parity generators unless the user manufactures his own ECC LSI chip specifically using his custom Hamming code. Since this alternative is not usually a realistic possibility, a custom design using SSI circuits is the only design choice. However, the use of SSI circuits requires much more printed circuit board space.

SUMMARY OF THE INVENTION

Accordingly, an object of the present invention is to provide a method and apparatus for translating a predetermined Hamming code to an expanded class of Hamming codes.

Another object of this invention is to translate a specific Hamming code in an error checking and correcting system which has been implemented in LSI form to an expanded class of modified Hamming codes.

Yet another object of the invention is to translate resident parity trees in an LSI ECC system to an expanded class of parity trees.

In carrying out the above and other objects, there is provided, in one form, an error checking and correcting (ECC) system particular to an LSI system having a predetermined Hamming code for checking and correcting the accuracy of data via check bits. The Hamming code forms a predetermined number of parity trees. A method of translating the predetermined Hamming code to an expanded class of modified Hamming codes which may more effectively satisfy the requirements of a user's system is provided. A sequence of data bits are encoded in accordance with the selected Hamming code to provide the check bits which are characteristic of the sequence of data bits. A predetermined set of check bit parity trees are selected and selectively encoded in accordance with a predetermined translation code to provide a set of modified check bits. The modified check bits are then substituted for selected ones of the subset of check bits. The resulting set of modified check bits is characteristic of the sequence of data bits as encoded in accordance with a selected one of the expanded class of modified Hamming codes. To decode the check bits and correct data, a predetermined set of syndrome bit generating parity trees are selected and selectively encoded in accordance with a predetermined translation code to provide a set of modified syndrome bits and native syndrome bits. The modified syndrome bits are for use external to the ECC system. The native syndrome bits are used for correction of data in the same manner as for an untranslated Hamming code ECC system.

The above and other objects, features and advantages of the present invention will be more clearly understood from the following detailed description taken in conjunction with the accompanying drawings.

DESCRIPTION OF A PREFERRED EMBODIMENT

Figures 1, 4, 5:
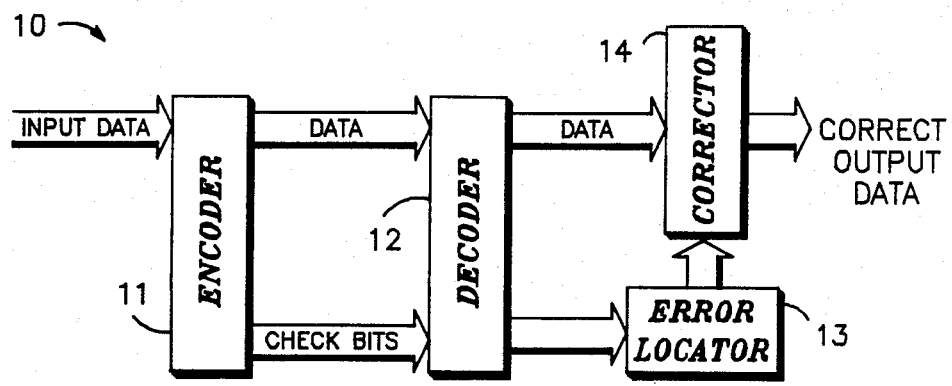
FIG. 1 illustrates in block diagram form an ECC system known in the prior art.
FIG. 4 illustrates in chart form an example of a parity tree library in accordance with a predetermined Hamming code associated with a subsystem of the ECC system of FIG. 3.
FIG. 5 illustrates in chart form the generation of an expanded parity tree from the library of FIG. 4.

Shown in FIG. 1 is a block diagram of a commonly used ECC system 10. Input data is coupled to an encoder 11 where the data is redundantly encoded with a checkbit word. Both the encoded checkbit word and the data pass through a potentially corrupting medium between an encoder 11 and a decoder 12. When the data is received at decoder 12, the data is then checked for accuracy and corrected if necessary. This is accomplished by generating new check bits from the transmitted data. The newly generated check bits are compared with the old check bits for discrepancies. This information is encoded as a syndrome word. From the syndrome word, an error locator 13 is capable of determining if and where an error has occurred in the data bits. The locator information is coupled to data correct logic 14 which corrects the erroneous datum.

Figure 2A:
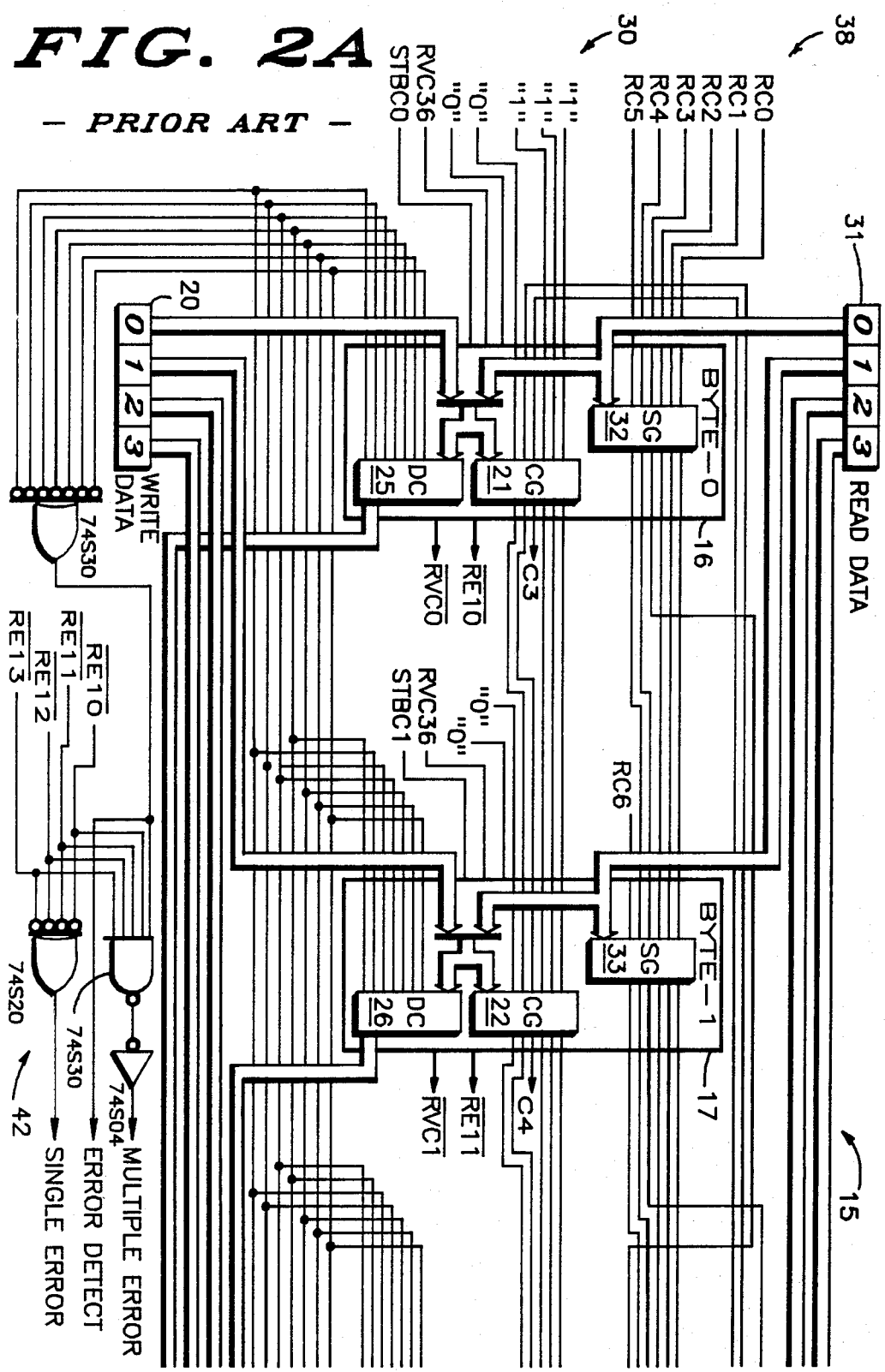
FIGS. 2(a) and 2(b) illustrate in block diagram form an implementation of the ECC system of FIG. 1 also known in the prior art.
Figure 2B:
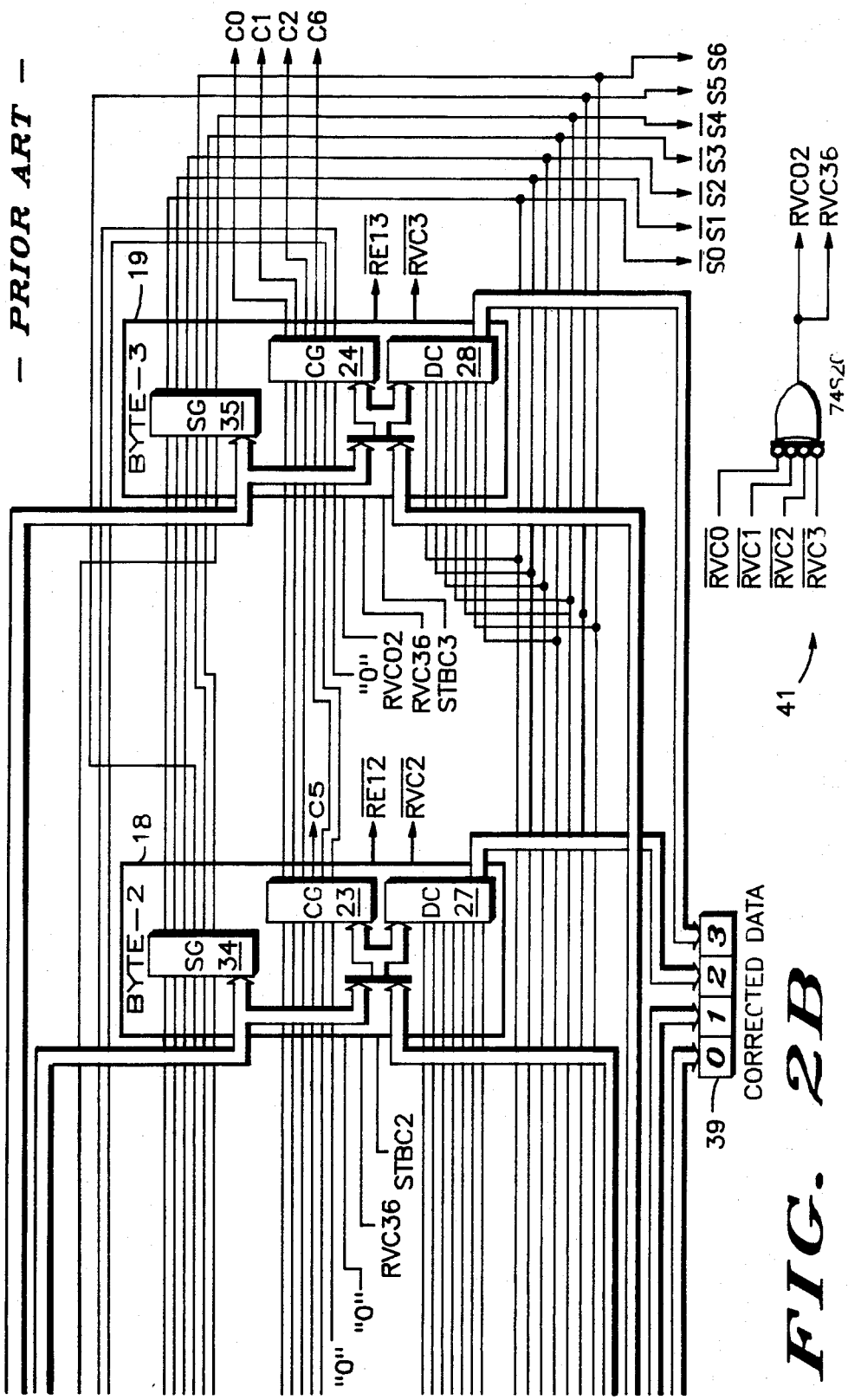

Shown in FIGS. 2(a) and 2(b) is a block diagram implementation of an ECC system 15 which is analogous to ECC system 10 of FIG. 1. ECC system 15 comprises four bit slice subsystems 16, 17, 18 and 19. The four subsystems of ECC system 15 are commercially available from Fujitsu Limited as a four byte system, each byte comprising eight bits of data. Although a four byte system with eight bits of data for each byte is shown, a subsystem having a different number of bytes and/or bits may be utilized. For each subsystem, encoding is accomplished by taking a parity across a predetermined pattern of selected input data and including a cascade parity input and providing a cascaded check bit output. For example, in ECC system 15 predetermined data is coupled to ECC system 15 at write data input 20 and divided into four bytes of eight bits each which are coupled to check bit generators 21, 22, 23 and 24 and disabled data correctors 25, 26, 27 and 28 of subsystems 16, 17, 18 and 19, respectively. Each check bit generation path passes sequentially through check bit generators 21–24 in accordance with a predetermined Hamming code. Predetermined input check bits 30 are coupled to predetermined inputs of check bit generators 21–24. Similarly, final check bits are selected from predetermined check bit outputs of check bit generators 21–24 in accordance with the predetermined Hamming code. This completes the encoding of data. At this point, the data may be coupled via any corruptable medium to a decoder.

To decode an error in data, data is coupled from read data terminal 31 to check bit generators 21–24, syndrome bit generators 32, 33, 34 and 35 and enabled data correctors 25, 26, 27 and 28. The data is again divided into four bytes with each byte having eight bits. The operation of syndrome bit generators 32–35 is directly analogous to the operation of check bit generators 21–24 with the exception that the initial cascade inputs 38 are the original output check bits instead of the constant inputs such as inputs 30 which were used in the original cascade generation of check bits. As such, the syndromes are logically equivalent to new independently generated check bits exclusive ORed with the original check bits. The resulting syndrome word is wrapped back around as an input to subsystems 16–19 in such a way that data correctors 25–28 are able to recognize and correct a correctable single bit error in their respective byte. Furthermore, data correctors 25–28 are capable of detecting any double bit and some multiple bit errors in a byte and providing an indiciation of such rather than correcting those errors. Data is then coupled to output data terminal 39. Control logic means 41 are associated with the correcting of check bits. Status logic means 42 provide external error status indicators.

Figure 3:
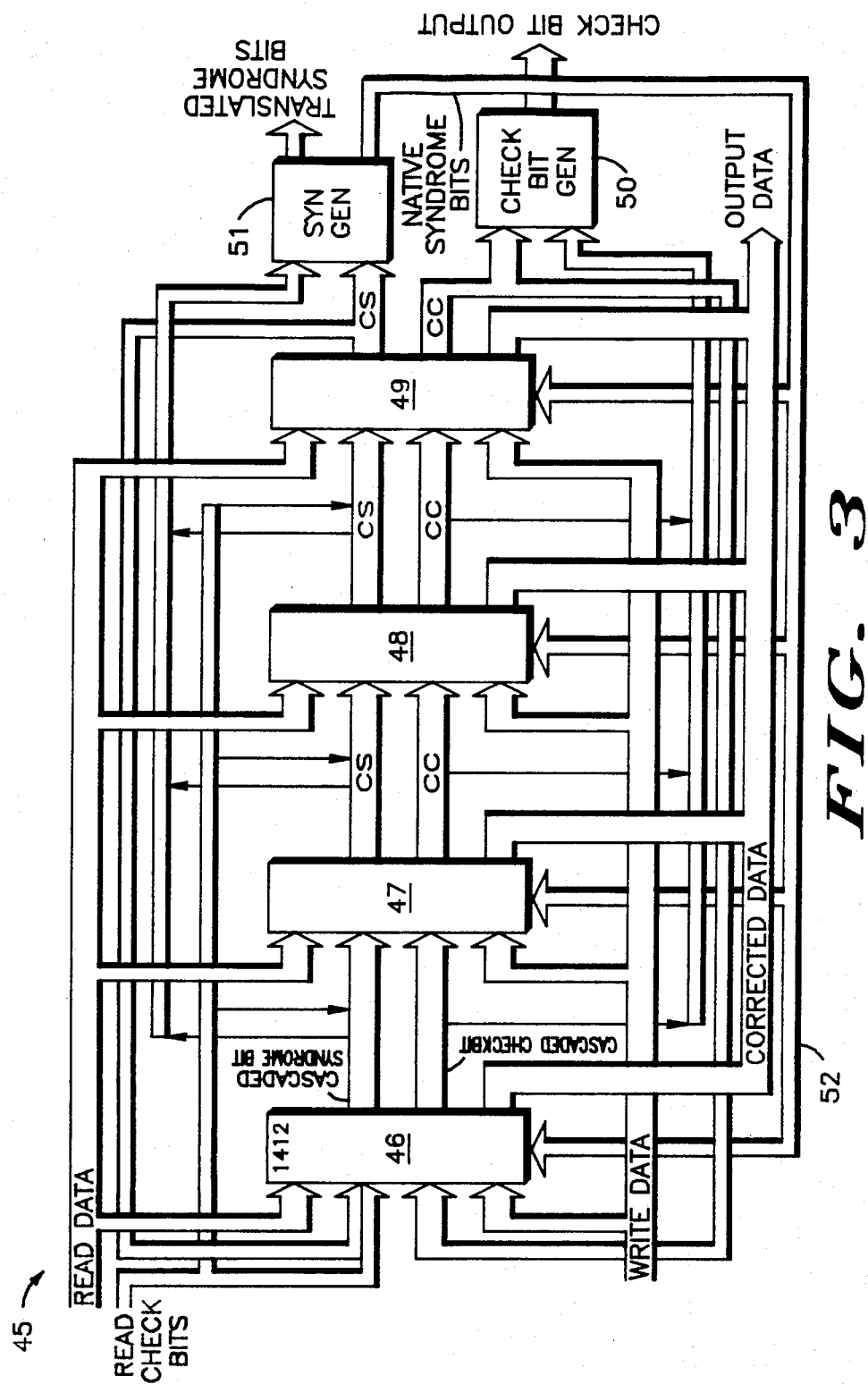
FIG. 3 illustrates in block diagram form an ECC system coupled to translation means for translating the Hamming code of the ECC system according to a preferred form of the present invention.

Shown in FIG. 3 is a block diagram of an ECC system 45 constructed in accordance with a preferred embodiment. The operation of system 45 is somewhat analogous to that of system 15 with some important exceptions.

To encode data, input data is coupled to subsystems 46, 47, 48 and 49 as write data. Each of subsystems 46, 47, 48 and 49 are equivalent to each of subsystems 16–19 of FIGS. 2(a) and 2(b). Check bits are cascaded in a manner to provide intermediate variables which constitute a superset of parity trees. A parity tree determines which bits of each byte are selected for inclusion in the generation of an associated check bit or syndrome bit. These intermediate variables may then be exclusive ORed to produce a translated check bit from a check bit generator 50.

To decode an error in data, the operation is similar as previously explained except the method of cascading syndrome bit generators (not shown) which are associated with subsystems 46, 47, 48 and 49 is modified. For syndrome bit generation, predetermined read check bits are selected for cascading into inputs of syndrome bit generators at various stages of the chain. At the syndrome output of various stages, intermediate syndrome variables contain a super set of required parity trees. As such, simple exclusive ORing of these variables in a syndrome bit generator 51 will generate a parity logically equivalent to that of a predetermined one of an expanded class of Hamming codes. This constitutes a translated syndrome word.

In order to use the resident data correctors (not shown) associated with subsystems 46–49 and analogous to data correctors 25–28 of ECC system 15, it is necessary to generate a native syndrome word. This word is then wrapped back around via a native syndrome bus 52 to predetermined inputs of the data correctors which are not detailed in subsystems 46–49. The method of operation is then exactly analogous to that previously explained. The corrected data of each byte is outputted on a corrected data bus to provide the correct output data.

Up to this point, the discussion has been based upon full word width encode or decode. A portion of the full word may be modified protecting the integrity of the redundant encoding as follows. Due to the separate syndrome and check bit generation paths, the recovered read data word is presented in entirety to the syndrome generation while only those parts of the recovered read data not to be replaced are presented for check bit generation. The remainder of the check bit generator is coupled to the input data. Upon the indication of an error, the resulting syndrome will either indicate an error in the discarded portion or reused portion of the read data. In the former case, the error is ignored since the data has been replaced. In the later case, the appropriate data corrector is activated by virtue of the syndrome word pattern to correct the erroneous bit. Also, check bits generated from the erroneous data are determined and corrected.

Previously, a predetermined Hamming code has been mentioned as existing. However, if ECC system 15 is desired to be used with another system utilizing a Hamming code, the Hamming code must be either identical or emulated. In many cases, the identical Hamming code is unacceptable. Therefore, emulation of the Hamming code used in ECC system 15 is the only alternative. If an objective Hamming code is divisible into boundaries and each pattern within those boundaries is identical to or produceable from resident patterns (parity trees) in an LSI bit slice ECC subsystem which spans a boundary, then a translation process may be developed.

To develop this translation process, consider a resident parity tree library for a predetermined byte of check bits as illustrated in FIG. 4. The presence of each "x" represents the inclusion of a particular bit in the cascaded checkbit output for the byte. Each horizontal line is the parity tree associated with the indicated check bits C0 through C5.

Illustrated in FIG. 5 is an example of how it is possible to expand the effective available parity trees in a given byte. The outputs of parity trees C3, C4 and C5 may be exclusive ORed together to provide the logical equivalent of a parity tree A having the inputs indicated in the lower horizontal line of FIG. 5. Note that each vertical column of the predetermined parity trees of the resident parity library has been logically exclusive ORed rather than horizontally exclusive ORed (cascaded).

In a particular subsystem, exclusive ORing of a particular parity tree output with its own cascade input isolates that particular parity tree by cancelling any cascaded input. Whereas, exclusive ORing of isolated parity trees in different bytes is an effective "horizontal exclusive ORing" or cascading. Further, exclusive ORing of isolated trees in the same byte yields an expanded parity tree library. Therefore, an arbitrary configuration of effective parity trees comprising an expanded class of Hamming codes may be realized.

In realizing ECC system 45, certain simplifications may be made based upon the desired objective Hamming code. This may be accomplished by properly selecting multiple cascade inputs on syndrome and/or check bit generation chains. Also, reductions may be obtained by algebraic reduction of exclusive OR terms required in the translation process. Syndrome bit generator 51 and check bit generator 50 which comprise the Hamming code translation means may be easily realized by using parity generators, a read only memory (ROM), or a programmable read only memory (PROM) depending upon the number of inputs and the complexity of translation. Therefore, a PROM may be programmed to provide a set of expanded parity trees in response to receiving a predetermined subset of parity trees at the input thereof, thereby realizing a translated Hamming code. By now it should be understood that a fixed Hamming code associated with an error checking and correcting system has been translated to an expanded class of Hamming codes.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. In an error checking and correcting system for encoding a sequence of data bits in accordance with a selected Hamming code to provide a set of native check bits, each of which is an output of a corresponding one of a set of predetermined parity trees applied across the sequence of said data bits, a method for translatiang the selected Hamming code to a selected one of an expanded class of modified Hamming codes, comprising the steps of:

selecting a predetermined subset of said parity trees;
selectively encoding the selected subset of said parity trees in accordance with a predetermined translation code to provide a modified parity tree;
providing a modified check bit as the output of said modified parity tree; and
substituting said modified check bit for a selected one of said native check bits, whereby the resultant set of check bits is characteristic of the sequence of data bits as encoded in accordance with said expanded class of modified Hamming codes.

2. In an error checking and correcting system for decoding errors in and correcting a sequence of data and check bits in accordance with a selected Hamming code to provide a set of native syndrome bits, each of which corresponds to a predetermined one of a set of predetermined parity trees applied across the sequence of said data and check bits, a method for translating the selected Hamming code to a selected one of an expanded class of modified Hamming codes, comprising the steps of:

selecting a predetermined subset of said parity trees;
selectively decoding the selected subset of said parity trees in accordance with a predetermined translation code to provide a modified parity tree and check bit;
providing a modified syndrome bit corresponding to said modified parity tree and check bit;
substituting said modified syndrome bit for a selected one of said native syndrome bits, whereby the resultant set of syndrome bits is characteristic of the sequence of data bits and check bits as encoded in accordance with said selected expanded class of modified Hamming codes;
providing the resultant set of syndrome bits as a native syndrome word; and
correcting an error, if any, in the sequence of data bits in accordance with the native syndrome word.

3. An error checking and correcting system for encoding and decoding a sequence of data bits in accordance with a selected Hamming code having predetermined uniform divisions to provide a set of related check bits and syndrome bits, comprising:

check bit generation means having an input for receiving data, and an output for providing check bit generating parity trees, each parity tree having a width equal to the width of the predetermined Hamming code divisions;
syndrome bit generation means having a first input for receiving data, a second input for receiving check bits, and an output for providing syndrome bit generating parity trees, each parity tree having a width equal to the width of the predetermined Hamming code divisions;
data correcting means having a first input for receiving data, a second input for receiving a syndrome word, and an output for providing corrected data; and
translation means having a first input coupled to the output of the syndrome bit generation means, a second input coupled to the output of the check bit generating means, a first output for providing translated check bits in accordance with the predetermined Hamming code thereby providing information external to the system identifying parity trees used by the system, a second output for providing translated syndrome bits in accordance with the predetermined Hamming code thereby providing information external to the system identifying data corrections, if any, which occur, and a third output coupled to the second input of the data correction means for providing the syndrome word for data correction.

4. The error checking and correcting system of claim 3 wherein said translation means comprise a read only memory circuit.

5. The error checking and correcting system of claim 3 wherein said translation means comprise a programmable read only memory circuit.

* * * * *